(12) United States Patent
Higashi

(10) Patent No.: US 8,139,135 B2
(45) Date of Patent: Mar. 20, 2012

(54) IMAGING APPARATUS AND SEMICONDUCTOR DEVICE

(75) Inventor: Koichi Higashi, Hadano (JP)

(73) Assignee: Art Analog Japan Limited, Kanagawa (JP)

(*) Notice: Subject to any disclaimer, the term of this patent is extended or adjusted under 35 U.S.C. 154(b) by 0 days.

(21) Appl. No.: 13/197,553

(22) Filed: Aug. 3, 2011

(65) Prior Publication Data

US 2012/0033122 A1   Feb. 9, 2012

(30) Foreign Application Priority Data

Aug. 4, 2010   (JP) .................................. 2010-174997

(51) Int. Cl.
*H04N 5/335* (2006.01)
(52) U.S. Cl. ..................................... 348/311; 250/208.1
(58) Field of Classification Search .................. 348/294, 348/311, 312; 257/431; 250/208.1
See application file for complete search history.

(56) References Cited

U.S. PATENT DOCUMENTS

| 5,389,968 A | * | 2/1995 | Koyanagi et al. ........... 348/222.1 |
| 2007/0023785 A1 | | 2/2007 | Hasuka et al. |
| 2010/0110261 A1 | * | 5/2010 | Ito et al. ........................ 348/311 |
| 2010/0165167 A1 | * | 7/2010 | Sugiyama et al. ............ 348/311 |

FOREIGN PATENT DOCUMENTS

| JP | 6-062322 A | 3/1994 |
| JP | 6-113216 A | 4/1994 |
| JP | 2007-036609 A | 2/2007 |
| JP | 2007-081942 A | 3/2007 |
| JP | 2009-038505 A | 2/2009 |
| JP | 2009-141462 A | 6/2009 |

* cited by examiner

*Primary Examiner* — Tuan Ho
(74) *Attorney, Agent, or Firm* — Sughrue Mion, PLLC

(57) ABSTRACT

An imaging apparatus using a CCD image sensor in which a size of a circuit for generating a voltage to be applied to a substrate of the CCD image sensor is reduced. A partial range within a voltage range from a supply voltage Vcc to 0 V is divided by a resistance voltage divider and one of different voltage values obtained as a result of voltage division is selected by a selector according to external data and outputted to a high voltage amplifier. The high voltage amplifier generates a voltage signal with a voltage expressed by $VMSUB = (Vdaout - Vdd2) \times (3R+R)/R + Vdd2 = 4 \times Vdaout - 3 \times Vdd2 (V)$ to make it a middle voltage for an exposure control signal.

6 Claims, 10 Drawing Sheets

FIRST DIGITAL CAMERA 1

DIGITAL CAMERA

IMAGING APPARATUS AND SEMICONDUCTOR DEVICE

FIELD OF THE INVENTION

The present invention relates to an imaging apparatus which captures images using a CCD image sensor.

BACKGROUND OF THE INVENTION

JP-A-2007-036609 discloses an imaging apparatus which captures an image by applying a voltage to a substrate of a CCD image sensor and superimposing the voltage on a signal for controlling the CCD image sensor.

SUMMARY OF THE INVENTION

The present invention has been made in view of the above background and has an object to provide an imaging apparatus and a semiconductor device which are designed to reduce the space occupied by a circuit for applying a voltage to the substrate of the CCD image sensor in a semiconductor device (IC/LSI) used for imaging.

Another object of the present invention is to provide an imaging apparatus and a semiconductor device which are designed to apply optimum voltages to the substrate of the CCD image sensor to broaden the dynamic range of image signals.

According to one aspect of the present invention, in order to achieve the above object, there is provided an imaging apparatus (5, 7) for capturing an image represented by an optical signal and converting the image into digital image data, in which the apparatus includes a CCD imaging device (2) and an electric signal processor (50, 70). The CCD imaging device has a plurality of light-receiving elements (202) each of which is formed on a semiconductor substrate (210) and converts an incoming optical signal into charge and accumulates the charge when a first voltage signal applied to the semiconductor substrate has a predetermined first voltage value (VLS) and discharges the accumulated charge when the first voltage signal has a predetermined second voltage value (VHS), in which an amount of accumulated charge is controlled when the first voltage signal has a third voltage value (VMSUB) between the first voltage value and the second voltage value, and the CCD imaging device outputs an analog electric signal indicating an amount of charge discharged from each of the light-receiving elements according to a control signal supplied from outside. The apparatus also includes a controller (112) which receives fourth power with a fourth voltage value (+3V/+1.8 V: Vcc/Vdd2) to operate and controls operation of the electric signal processor. The electric signal processor (50, 70) includes: a converter circuit (102) which converts the output electric signal into the image data; a control signal supply circuit (122, 124) which supplies the control signal; a power supply circuit (6) which supplies third power (VMSUB) with a voltage value corresponding to the third voltage value; and a voltage signal application circuit (502) which selects power with the first voltage value (VLS) supplied from outside, power with the second voltage value (VHS) supplied from outside, or the supplied third power (VMSUB) and applies the selected power as the first voltage signal to the semiconductor substrate (210) of the CCD imaging device (2). The power supply circuit (6) includes a power generator circuit (62) which receives fifth power (VH) with a voltage value higher than the voltage of the fourth power (+3 V) to operate and generates third power (VMSUB) with a voltage value corresponding to the third voltage value (VMS) from a second voltage signal (Vdaout) having a voltage value between the fourth voltage value (+3 V) and 0 V, and a second voltage signal generator circuit (60) which receives the fourth power (+3 V) to operate and generates the second voltage signal (Vdaout) according to control from the controller (112).

In the above description, the reference numerals and signs which are used to describe the elements in Claim 1 of this specification and accompanying drawings are shown in parentheses. These reference numerals and signs are shown in order to help understand the invention and are not intended to limit the technical scope of the invention.

According to the present invention, in the semiconductor device of an imaging apparatus for capturing images by applying voltages to the substrate of the CCD image sensor, the space occupied by the circuit for applying voltages to the substrate of the CCD image sensor can be reduced.

Also, according to the present invention, the dynamic range of image signals can be broadened by applying optimum voltages to the substrate of the CCD image sensor in the imaging apparatus.

DETAILED DESCRIPTION OF THE PREFERRED EMBODIMENTS

[Process Leading to the Present Invention]

The process leading to the present invention will be described to help understand the embodiments of the present invention.

In order to obtain high-resolution image signals from a CCD imaging apparatus, the value of the voltage, which is applied to the substrate of the CCD image sensor and is superimposed on the signal used to control the CCD image sensor, is changed depending on the imaging mode (still image mode or pixel addition mode) as exemplified by the imaging apparatus disclosed in Japanese Unexamined Patent Application Publication No. 2007-036609.

As in this technique, when a digital/analog (D/A) circuit is only used to obtain the voltage to be applied to the substrate of the CCD image sensor directly from data representing the voltage, a circuit which operates at the voltage applied to the CCD image sensor (for example, −6V to +12 V) is required for operation of the D/A circuit.

On the other hand, in an image sensor, generally a circuit for processing image data obtained by digitalization of image signals from a CCD image sensor and another digital circuit for controlling CCD image sensor control timing operate at a voltage (for example, +3 V; Vcc) lower than the voltage applied to the substrate of the CCD image sensor.

The above circuit which generates the voltage to be applied to the CCD image sensor should have a wider area than the other digital circuits because it handles high voltages (a wide range of voltages). In concrete terms, as of 2010, for digital circuits which operate at +3 V, typically the transistor gate length is in the range of 0.3 μm to 0.35 μm and the gate width is 1 μm or less while for digital circuits which operate at a voltage in the range from −6 V to +12 V, typically the transistor gate length is in the range of 1.5 μm to 2.5 μm and the gate width is 3 μm or less. The latter transistor size is much larger than the former transistor size.

In the imaging apparatus according to the present invention, taking the abovementioned transistor size difference into consideration, the circuit for generating the voltage to be applied to the substrate of the CCD image sensor is divided into two circuits: one is a D/A circuit which operates at the same voltage as the other digital circuits and the other is an amplifier circuit which operates at a higher voltage than the other digital circuits and a voltage with polarity reverse to the polarity of that voltage and can change the voltage obtained by the D/A circuit to a required level and has a required driving capacity.

The AFE integrated circuits, which include an analog front end (AFE) digital-converting an image signal of the CCD image sensor with analog tipe (AFE ICs; the semiconductor chips (semiconductor devices) used for AFE ICs are called "AFE chips"), are roughly classified into the following two types:

(1) 3-in-1 Type

Figure 2:
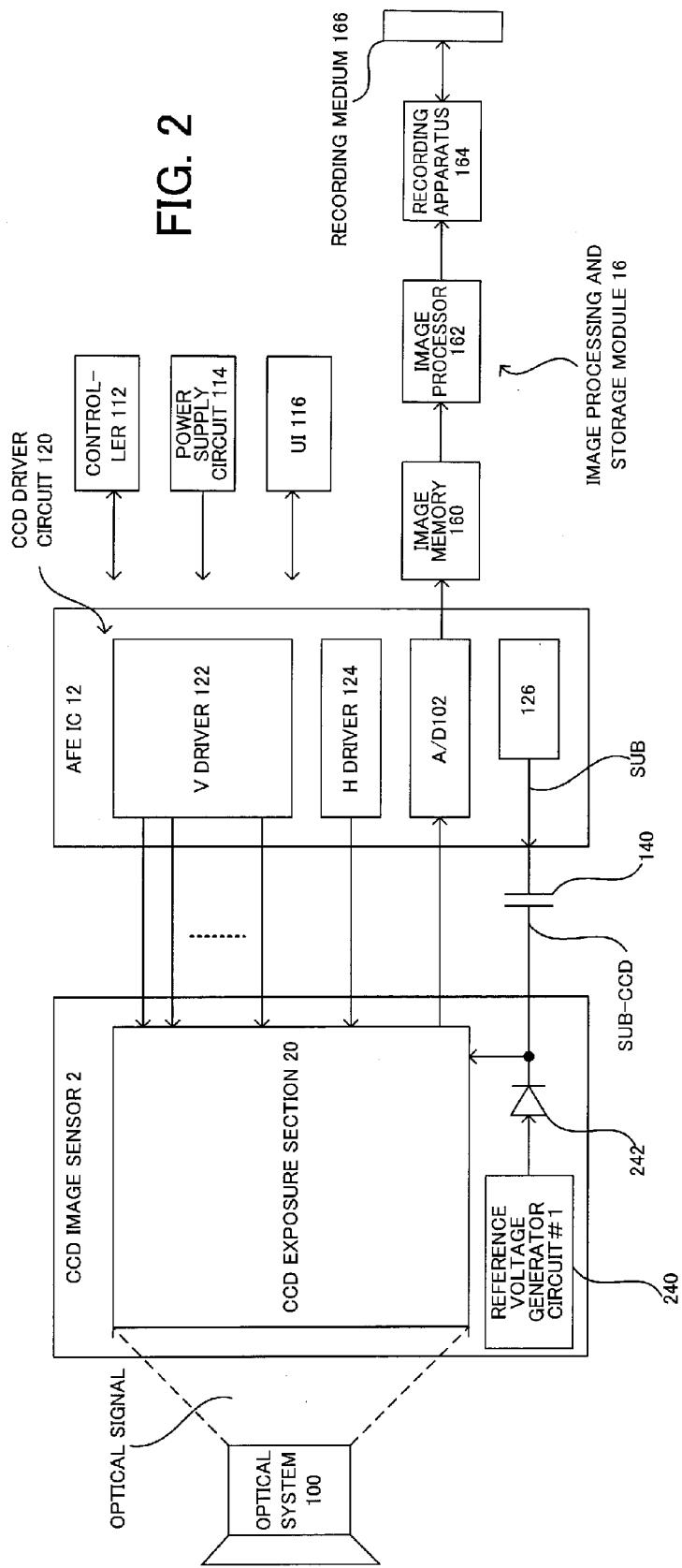
FIG. 2 illustrates the configuration of the digital camera 1 shown in FIG. 1.

In this type of AFE IC, the V driver 122 shown in FIG. 2, etc and a control signal data generator 3 are formed on the same IC chip.

In the 3-in-1 type AFE IC, the AFE, vertical driver (V driver) and timing generator (TG) are contained in a single package, in which the TG and V driver are connected inside the IC.

(2) 2-in-1 Type

In this type of AFE IC, the V driver 122 shown in FIG. 2, etc and the control signal data generator 3 are formed on different IC chips.

In the 2-in-1 type AFE IC, the AFE and V driver are contained in a single package, in which the TG and V driver are connected outside the IC (on the printed circuit board).

When the 3-in-1 type AFE IC is employed, printed wires of the apparatus are easily made because the TG and V driver are connected inside the IC.

On the other hand, when the 2-in-1 type AFE IC is employed, the TG and V driver are connected on the printed circuit board outside the IC. Thus, the circuit size inside the IC needing an expensive high pressure process should be smaller than when the 3-in-1 type AFE IC is employed, but the number of printed wires should be larger.

The concrete examples given below are only intended to clarify and embody the present invention and are not intended to limit the technical scope of the present invention.

[First Digital Camera 1]

Next, the first digital camera will be described.

Figure 1:
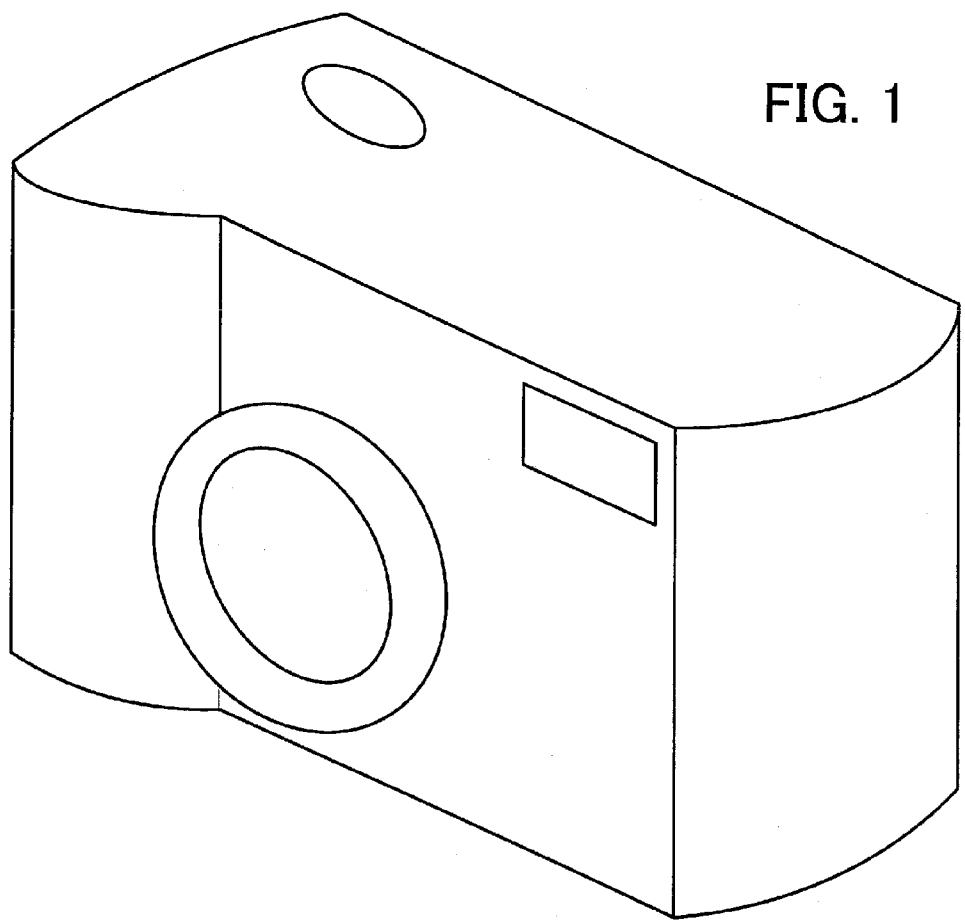
FIG. 1 illustrates the external appearance of a digital camera to which the present invention is applied.

FIG. 1 illustrates the external appearance of the digital camera to which the present invention is applied.

FIG. 2 illustrates the configuration of the digital camera 1 shown in FIG. 1.

As shown in FIG. 2, the digital camera 1 shown in FIG. 1 includes an optical system 100, a first CCD image sensor 2, a first AFE IC 12, an image processing and storage module 16, a controller 112, a power supply circuit 114, a user interface (UI) 116, and a capacitor 140.

The CCD image sensor 2 includes a CCD exposure section 20 (which will be described later referring to FIG. 3), a first reference voltage generator circuit (reference power generator circuit #1) 240 and a diode 242.

The AFE IC 12 includes a first CCD driver circuit 120 and an analog/digital converter circuit (A/D) 102 and the CCD driver circuit 120 includes a vertical driver circuit (V driver) 122, a horizontal driver circuit (H driver) 124, and a substrate power supply circuit 126.

The image processing and storage module 16 includes an image memory 160, an image processor 162 and a recording apparatus 164 for recording image data on a recording medium 166.

The reference voltage generator circuit 240, for example, generates power with a voltage from 0 V to +3 V and constitutes a clamp circuit in combination with the diode 242.

Thus configured, the first digital camera 1 converts the optical image signal received through the optical system 100 into electric charge and generates image data representing an optical image and outputs it.

The components of the digital camera can be implemented by dedicated hardware or software on an OS executed by a DSP or CPU (not shown).

Also, two or more components of the digital camera 1 can be united or any component of the digital camera 1 can be divided into more subcomponents on a function-by-function basis.

The digital camera illustrated in FIGS. 1 and 2 is a digital still camera to which the invention is applied; however the present invention may be applied to other types of image processing apparatus including digital video cameras (the same is true for the digital cameras described later).

In the other drawings, the same components or processes are designated by the same reference numerals.

Also, hereinafter, when a component may include a plurality of similar components and a particular component among them is not specified in the explanation, the reference numeral for the component(s) may be abbreviated; for example, PD 202-1-1 to PD **202-*m*-2*n* in FIG. 3 may be abbreviated as PD 202**.

[CCD Image Sensor 2]

Figure 3:
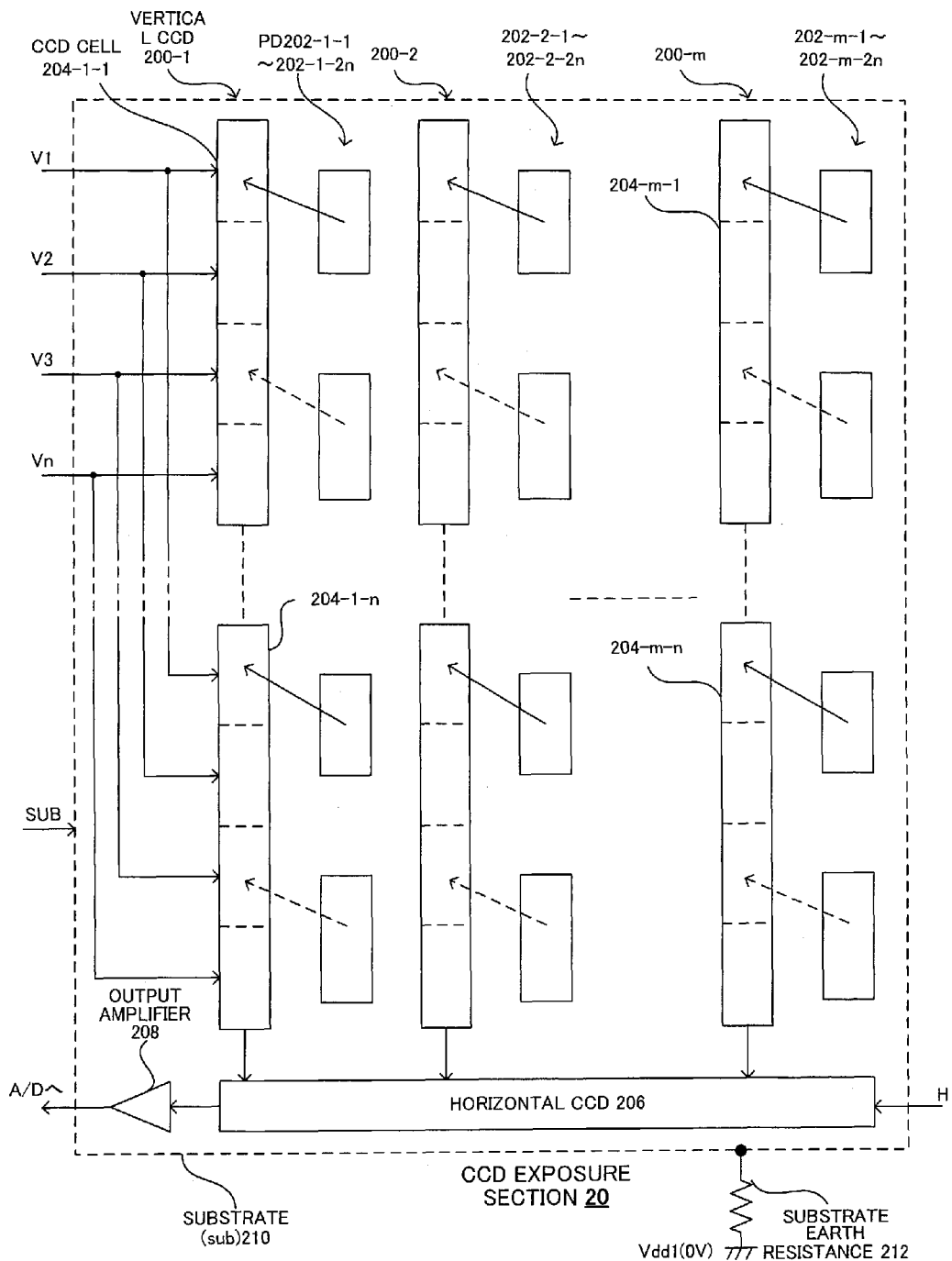
FIG. 3 illustrates the configuration of the CCD image sensor 1 shown in FIG. 2.

FIG. 3 illustrates the configuration of the CCD exposure section 20 of the CCD image sensor 2 shown in FIG. 2.

Figure 4:
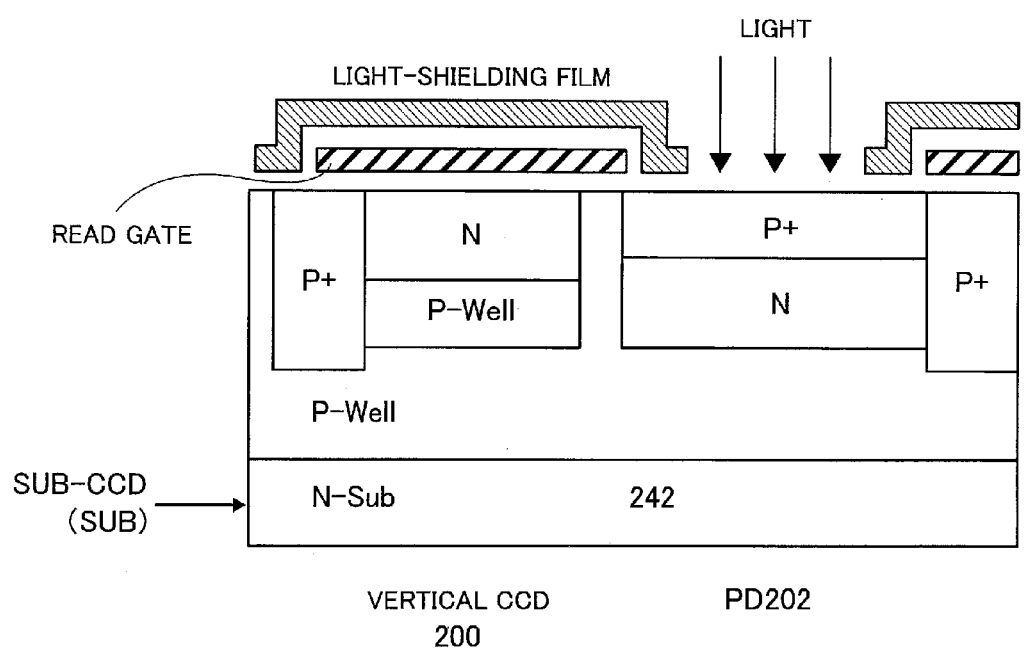
FIG. 4 illustrates the structure of the vertical CCD and PD of the CCD exposure section shown in FIG. 3.

FIG. 4 illustrates the configuration of the vertical CCD 200 and PD 202 of the CCD exposure section 20 shown in FIG. 3.

As shown in FIGS. 3 and 4, the CCD exposure section 20 is a frame-read type CCD image sensor which includes vertical CCDs 200-1 to **200-*m* each including n vertical CCD cells 204-*r*-*s* and 2n photodiodes (PD) 202-*r*-2*s*, a horizontal CCD 206, and an output amplifier 208**.

As shown in FIG. 3, among the components of the CCD image sensor 2, at least the vertical CCD cell **204-*r*-*s*, photodiode 202-*r*-2*s*, vertical CCDs 200-1 to 200-*m*** and horizontal CCD 206 are formed on an n-type semiconductor substrate (N-sub) 210 connected to the Vdd1 (0 V) ground through a substrate earth resistance 212.

Here, i, j, m, n, r, and s are integral numbers, in which m≧i, r≧1, n≧j, and s≧1 and m and n are numbers which are not always constant.

In the digital camera 1 (FIG. 2, etc.), the image processing and storage module 16 and the controller 112 receive power with a voltage for an ordinary logical circuit (for example, +3 V (Vcc) or +1.8 V (Vdd 1)) to operate, and the image processing and storage module 16 includes a CPU and a memory, executes the program for controlling the components of the digital camera 1 (these are not shown) and controls operation of the components of the digital camera 1.

In the image processing and storage module 16, the image memory 160 stores digital image data received from the AFE IC 12, for example, on a field-by-field basis or frame-by-frame basis and outputs it to the image processor 162.

The image processor 162 processes the image data received from the image memory 160 (for example, compression) and outputs the processed data to the recording apparatus 164.

The recording apparatus 164 records the image data received from the image processing and storage module 165 onto the recording medium 166.

The user interface (UI) 116 includes an image display unit, a shutter, a mode select dial and various buttons (these are not shown) and deals with various operations of the digital camera by the user and displays image data for the user.

The power supply circuit 114 supplies required power to various parts of the digital camera 1.

For example, the AFE IC 12 is configured as a special LSI (3-in-1 type AFE IC) on a single semiconductor chip, and in the CCD driver circuit 120 of the AFE IC 12, the V driver 122 of the CCD driver circuit 120 supplies a vertical drive signal V to the CCD image sensor 2.

The H driver 124 supplies a horizontal drive signal H to the CCD image sensor 2.

The A/D 102 converts the analog image signal received from the CCD image sensor 2 into digital image data and outputs it to the image processing and storage module 16.

Figure 5:
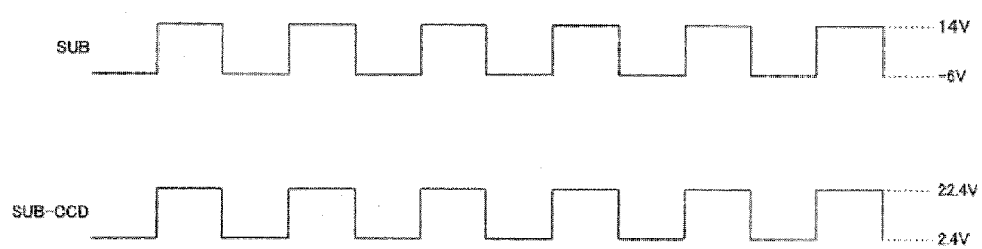
FIG. 5 illustrates substrate power SUB supplied by the substrate voltage generator circuit of the first digital camera shown in FIG. 2 and a voltage signal SUB-CCD which is outputted from the second clamp circuit including a first reference voltage generator circuit and a diode and applied to the substrate (FIGS. 3 and 4) of the CCD exposure section of the CCD image sensor.

FIG. 5 shows substrate power SUB supplied by the substrate voltage generator circuit 126 of the first digital camera 1 shown in FIG. 2 and a voltage signal SUB-CCD which is outputted from the clamp circuit including the reference voltage generator circuit 240 and diode 242 and applied to the substrate 210 (FIGS. 3 and 4) of the CCD exposure section 20 of the CCD image sensor 2.

For example, according to control from the controller 112, the substrate voltage generator circuit 126 supplies power SUB with a voltage of +14 V or −6 V to the capacitor 140 as a constituent of the clamp circuit, as shown in FIG. 5.

The capacity of the capacitor 140 is set to a value which allows these voltage signals to pass adequately.

In the CCD exposure section 20, the PD 202 accumulates the charge generated according to the light received through the optical system 100, depending on the value of the substrate voltage signal (SUB-CCD/SUB) applied as a bias voltage to the substrate 210, and sends the accumulated charge to the substrate 210 to reset.

Since the amount of charge accumulated in the PD 202 is controlled by the voltage value VMS of the voltage signal SUB-CCD applied to the substrate 210, the voltage value VMS of the voltage signal SUB-CCD is adjusted so as to optimize operation of the CCD image sensor 2 according to any of the various operation modes of the digital camera 1 (for example, pixel addition mode).

Figure 6:
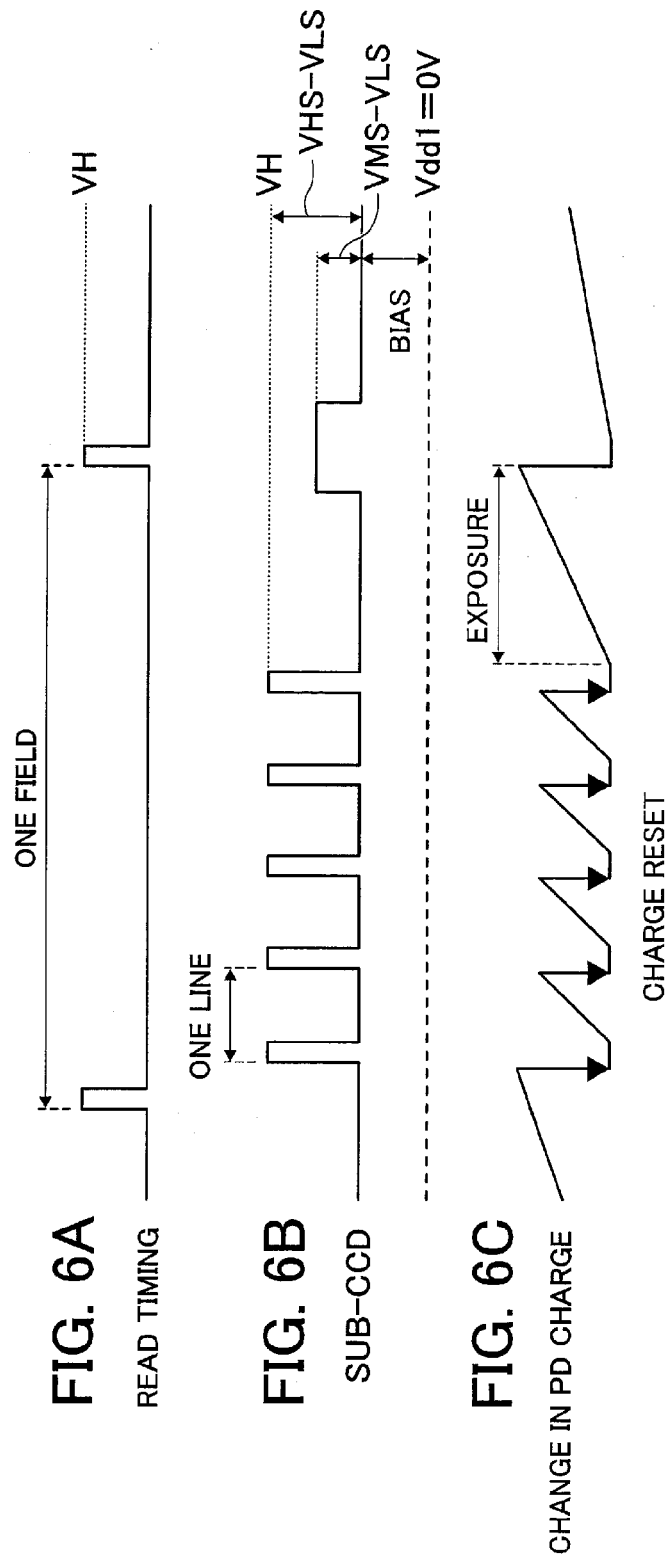
FIG. 6A shows timing to read charge from the PD to the vertical CCD in the CCD image sensor shown in FIGS. 2 to 4.
FIG. 6B shows the voltage signal SUB-CCD applied to the substrate of the CCD exposure section.
FIG. 6C shows the amount of charge accumulated in the PD.

FIG. 6A shows timing to read charge from the PD 202 to the vertical CCD 200 in the CCD image sensor 2 shown in FIGS. 2 to 4, FIG. 6B shows the voltage signal SUB-CCD applied to the substrate 210 of the CCD exposure section 20, and FIG. 6C shows the amount of charge accumulated in the PD 202.

The voltage signal, supplied from the V driver 122, etc. and applied to the read gate (located under the light shielding film shown in FIG. 4) between the vertical CCD 200 and PD 202, comes to have a high voltage value VH, as shown in FIG. 6A, each time the CCD exposure section 20 captures one field of image, and when the voltage signal reaches the high voltage value VH, the charge is transferred from the PD 202 to the vertical CCD 200.

As shown in FIG. 6B, the voltage value of the voltage signal SUB-CCD applied to the substrate 210 is increased to the high level (VHS) per period required to capture one line of image except the exposure period in order to prevent saturation of the charge accumulated in the PD 202 and control the amount of exposure optimally. As shown in FIG. 6C, the PD 202 is reset each time the voltage signal of high voltage value VHS is applied to the substrate 210 by sending the charge accumulated so far to the substrate 210.

When the voltage signal applied to the substrate 210 does not have the high voltage value VHS, it has a low voltage value VLS.

In the CCD image sensor 2 in the pixel addition mode, a bias voltage is applied to the voltage signal SUB-CCD and the voltage is made to be a middle voltage value VMS to limit the amount of charge accumulated in the PD 202 and thereby prevent saturation of the charge added in the vertical CCD 200.

In the exposure period, the value of the voltage signal applied to the substrate 210 does not become high voltage value VHS, and the PD 202 converts incident light into charge and accumulates it.

The vertical CCD 200 transfers the charge received from the PD 202 to the horizontal CCD 206 sequentially according to vertical timing signal V from the V driver 122 of the CCD driver circuit 120.

The horizontal CCD 206 transfers the charge received from the vertical CCD 200 to the output amplifier 208 sequentially according to horizontal timing signal H from the H driver 124 of the CCD driver circuit 120.

The output amplifier 208 generates an image signal for the voltage corresponding to the charge received from the horizontal CCD 206 and outputs it to the A/D 102 (FIG. 2).

[Second Digital Camera 3]

Next, the second digital camera 3 will be described.

Figure 7:
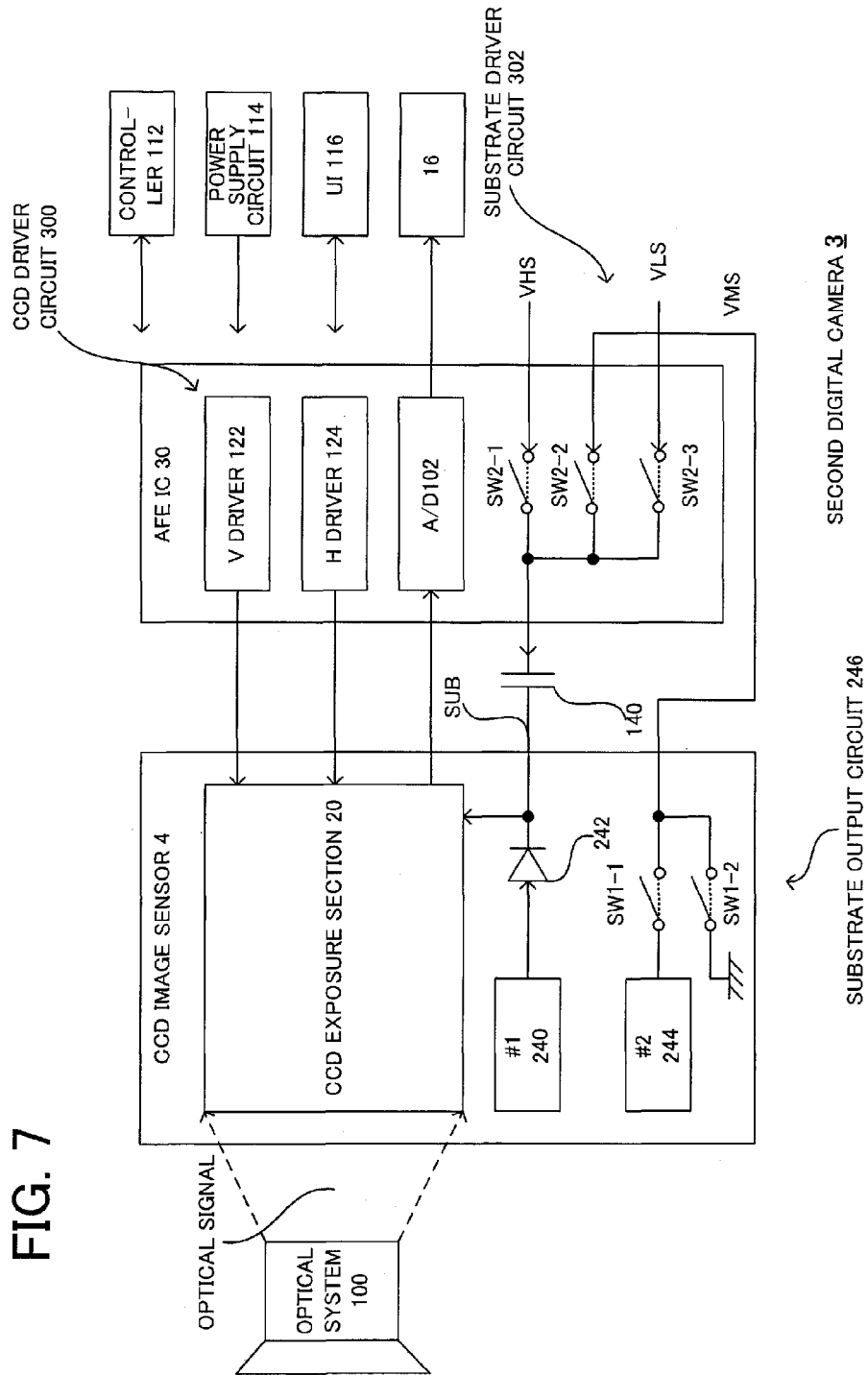
FIG. 7 illustrates the configuration of a second digital camera according to the present invention.

FIG. 7 illustrates the configuration of the second digital camera 3.

As shown in FIG. 7, in the second digital camera 3, the first CCD image sensor 2 of the first digital camera 1 is replaced by a second CCD image sensor 4 and the first AFE IC 12 of the first digital camera is replaced by a second AFE IC 30.

In the second AFE IC 30, the first CCD driver circuit 120 of the first AFE IC 12 is replaced by a second CCD driver circuit 300, and in the second CCD driver circuit 300, the substrate voltage generator circuit 126 of the first CCD driver circuit 120 is replaced by a substrate driver circuit (SUB driver circuit) 302.

The second CCD image sensor 4 is configured to add a second reference voltage generator circuit 244 for generating a voltage signal with the above-mentioned voltage value VMS and a voltage signal output circuit (SUB output circuit) 246 to the first CCD image sensor 2.

Thus configured, the second digital camera 3 converts the optical image signal received through the optical system 100 into electric charge and generates image data representing an optical image and outputs it, like the first digital camera 1.

The SUB output circuit 246 includes first and second switches SW1-1 and SW1-2 and the substrate driver circuit 302 includes first to third switches SW2-1 to SW2-3.

In the SUB output circuit 246, according to control from the controller 112, the first switch SW1-1 closes only in the pixel addition mode and outputs power with middle voltage value VMS generated by the second reference voltage generator circuit 244 to the second switch SW2-2 of the substrate driver circuit 302 of the CCD driver circuit 300.

According to control from the controller 112, the second switch SW1-2 opens only in the pixel addition mode and closes in the normal mode to make the voltage signal of the second switch SW2-2 of the substrate driver circuit 302 0 V.

In the CCD driver circuit 300 of the second AFE IC 30, according to control from the controller 112, the first to third switches SW2-1 to SW2-3 of the substrate driver circuit 302 open and close the connection between the power with voltage values VHS, VMS and VLS supplied to the substrate driver circuit 302 and the capacitor 140, and change the voltage value of the voltage signal applied to the substrate 210 of the CCD exposure section 20 of the CCD image sensor 4, as illustrated in FIG. 6B.

[Third Digital Camera 5]

Next, the third digital camera 5 according to the present invention will be described.

Figure 8:
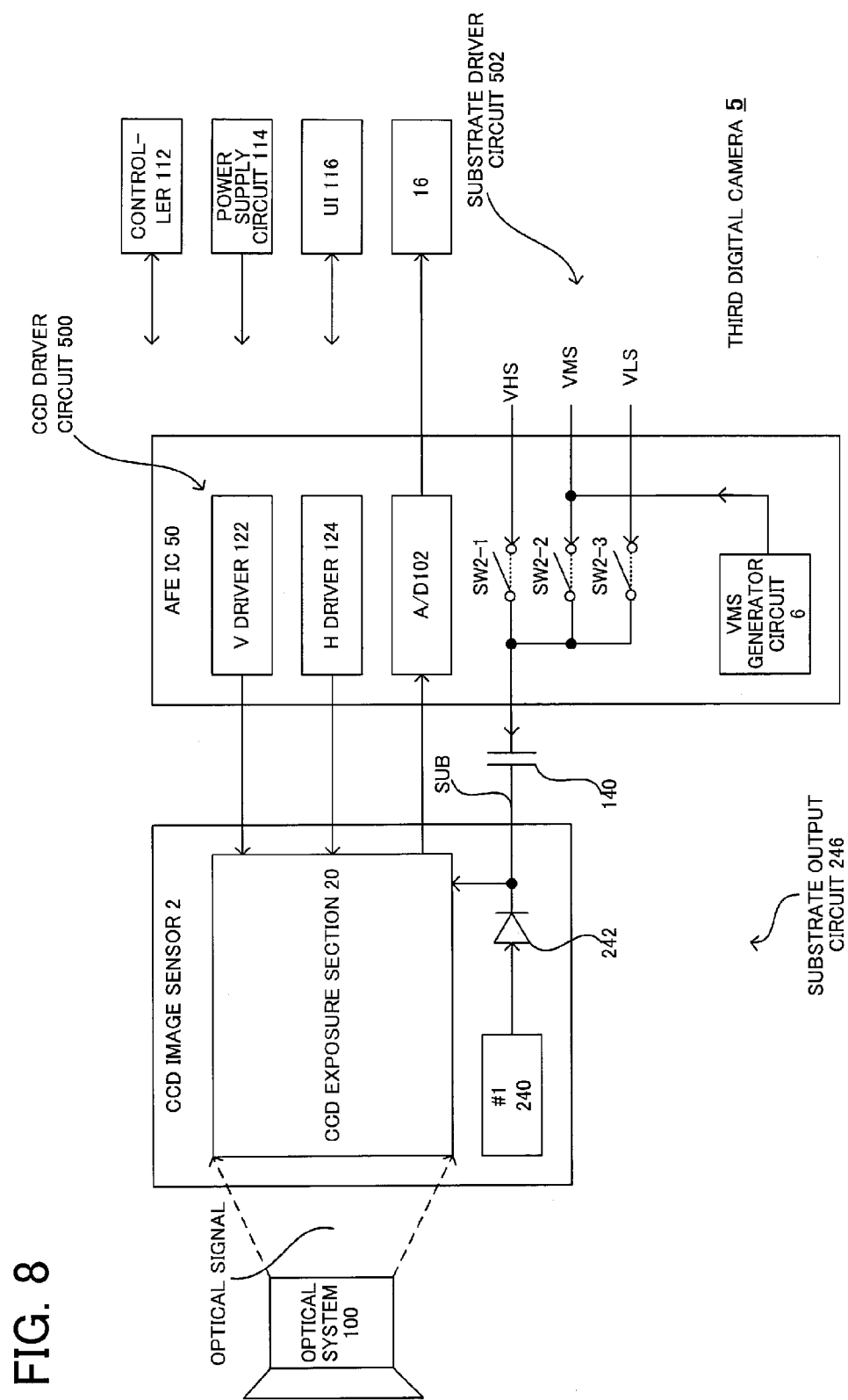
FIG. 8 illustrates the configuration of a third digital camera according to the present invention.

FIG. 8 illustrates the configuration of the third digital camera 5.

As shown in FIG. 8, in the third digital camera 5 to which the present invention is applied, the first AFE IC 12 of the first digital camera 1 (FIG. 2, etc.) is replaced by a third AFE IC 50, and in the third AFE IC 50, the first CCD driver circuit 120 of the first AFE IC 12 is replaced by a third CCD driver circuit 500, and in the third CCD driver circuit 500, the substrate voltage generator circuit 126 of the first CCD driver circuit 120 is replaced by a second substrate driver circuit 502 and a middle voltage power generator circuit (VMS generator circuit) 6.

The second substrate driver circuit 502 includes first to third switches SW2-1 to SW2-3 which open and close according to control from the controller 112.

[Middle Voltage Power Generator Circuit 6]

Figure 9:
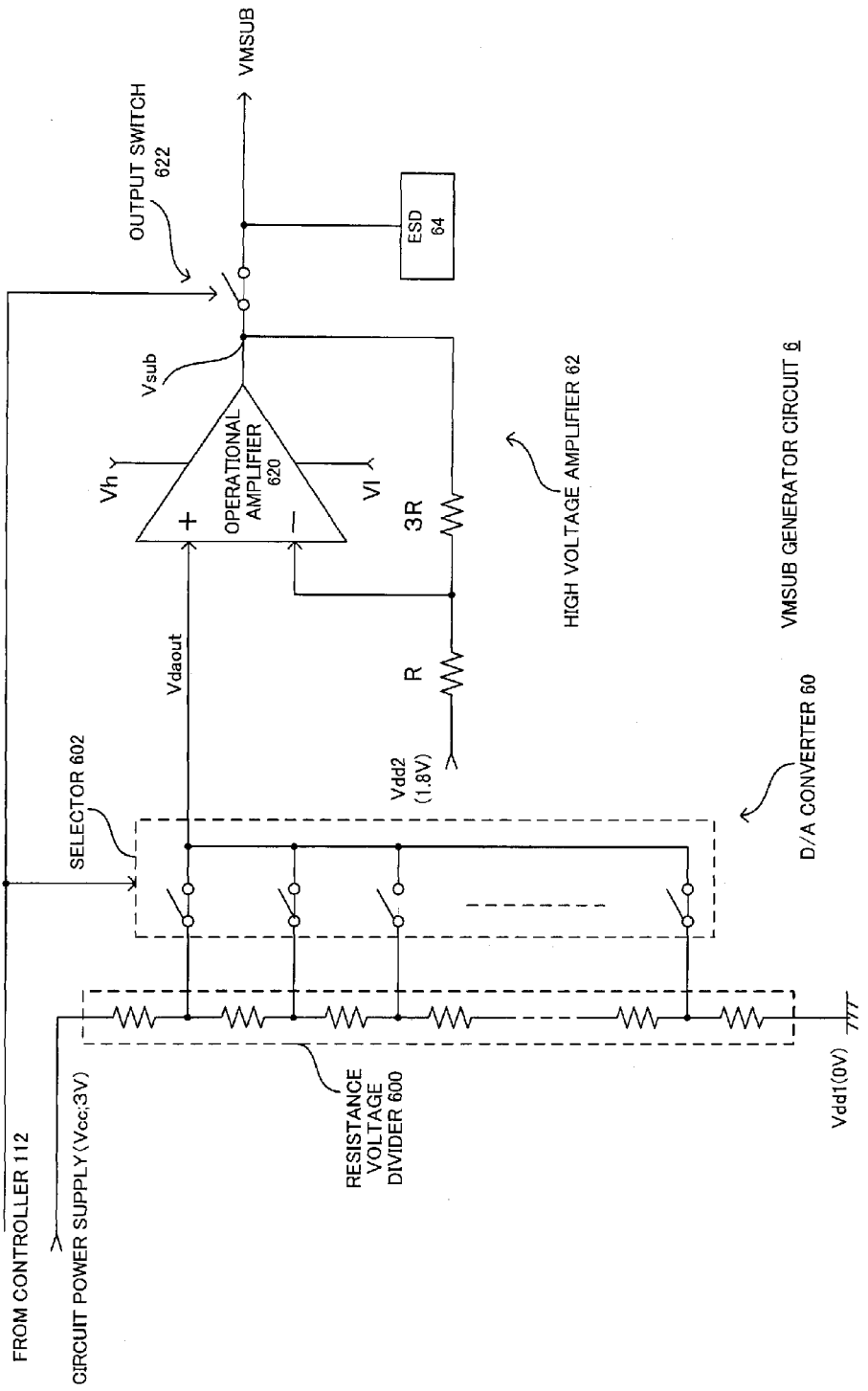
FIG. 9 illustrates the configuration of the substrate voltage signal generator circuit of the AFE integrated circuit shown in FIG. 2, etc.

FIG. 9 shows the configuration of the middle voltage power generator circuit (VMSUB generator circuit) 6 of the third CCD driver circuit 500 of the third AFE IC 50 of the third digital camera 5 shown in FIG. 8.

As shown in FIG. 9, the middle voltage power generator circuit 6 includes a digital/analog converter (D/A converter) 60 and a high voltage amplifier 62.

For the purpose of clarification and concretization for illustration, FIG. 9 shows a case that the D/A converter 60 divides a partial voltage range within the range from Vcc (+3) to 0 V equally into 256 parts and the voltage amplification factor of the high voltage amplifier 62 is 4. This is just illustrative and the number of voltage divisions of the D/A converter 60 and the voltage amplification factor of the high voltage amplifier 62 may be modified as appropriate, depending on the configuration of the digital camera 5.

The D/A converter 60 includes a resistance voltage divider 600 and a selector 602.

The high voltage amplifier 62 includes an operational amplifier 620, an output switch 622, an electrostatic discharge protection circuit (ESD 64), and two resistors for negative feedback (resistor R with resistance R and resistor 3R with resistance 3R).

Thus configured, the middle voltage power generator circuit 6 generates power SUB with voltage value VMS to be applied to the substrate 210 of the CCD image sensor 2 according to setting from the controller 112 and outputs it through the capacitor 140 to the clamp circuit (reference voltage generator circuit 240 and diode 242) connected to the substrate 210 (FIG. 3) of the CCD exposure section 20 of the CCD image sensor 2.

According to setting of data from the controller 112, the D/A converter 60 outputs one of 256 different voltage values obtained by dividing the range of +2.8 V to 0 V within the range of Vcc (+3 V) to Vdd1 (0 V).

In other words, in the D/A converter 60 of the middle voltage power generator circuit 6, the resistance voltage divider 600 has many resistors with an equal resistance value connected in series between power Vcc voltage (+3 V) and voltage Vdd1 (0 V), divides the range of +2.8 V to 0 V within the range of Vcc (+3 V) to Vdd1 (0 V) equally into 256 parts, and outputs each of the voltage values thus obtained by the voltage division to the selector 602.

The selector 602 includes 256 switches with input terminals to which any of the 256 different voltage values divided by the resistance voltage divider 600 are applied, and any of these switches is selected according to control from the controller 112.

When closing in response to the control from the controller 112, a switch outputs the inputted voltage Vdaout to it through its output terminal to the high voltage amplifier 62.

The ESD 64 removes the charge generated at the output terminal of the operational amplifier 620 to protect the middle voltage power generator circuit 6 and the components of the digital camera 5 connected with it.

The high voltage amplifier 62 generates a middle voltage VMSUB from the voltage Vdaout received from the D/A converter 60 and outputs it to the SUB driver circuit 502 through the output switch 622.

As shown in FIG. 9, the operational amplifier 620 receives positive power with voltage VH (for example, +6 V) higher than the voltage Vcc and negative power with voltage VL having polarity reverse to it (for example, −6 V) from the power supply circuit 114 to operate.

The + input terminal of the operational amplifier 620 is a non-inverting input terminal and its − input terminal is an inverting input terminal, and due to its nature as a stand-alone operational amplifier, when a voltage Vi is applied between the + input terminal and − input terminal, the operational amplifier 620 amplifies the voltage according to its amplification factor A and outputs voltage A×Vi.

The operational amplifier 620 and two feedback resistors R and 3R constitute an amplifier with a voltage amplification factor of 4 which amplifies the voltage signal Vdaout received from the D/A converter 60 and generates substrate voltage signal VMSUB.

The feedback resistor 3R is connected between the output terminal of the operational amplifier 620 and the − input terminal of the operational amplifier 620, and the feedback resistor R is connected between the − input terminal of the operational amplifier 620 and the power supply voltage Vdd2 (for example, +1.8 V).

Since the voltage Vdaout from the D/A converter 60 is inputted to the + input terminal of the operational amplifier 620, the operational amplifier 620 operates so that the voltage obtained by dividing voltage Vsub at the output terminal of the operational amplifier 620 by the feedback resistor 3R and feedback resistor R, (Vsub−Vdd2)/4+Vdd2, is equal to Vdaout.

In other words, the following equation holds: Vdaout=(Vsub−Vdd2)/4+Vdd2. The voltage value Vsub of the voltage signal Vsub outputted from the operational amplifier 620 is calculated from the following equation:

$$Vsub = 4 \times Vdaout - 3 \times Vdd2$$

so, if Vdd2 is 1.8V, the voltage value Vsub is in the following range: −5.4 V≦Vsub≦5.8 V.

According to control from the controller 112, the output switch 622 of the middle voltage power generator circuit 6 closes at the time when the substrate voltage signal SUB from the middle voltage power generator circuit 6 is applied to the substrate 210 (FIG. 3) of the CCD exposure section 20 of the CCD image sensor 2, and outputs it to the second switch SW2-2 and for the rest of time, it remains open.

In the second substrate driver circuit 502, the first to third switches SW2-1 to SW2-3 open and close according to control from the controller 112 as in the first substrate driver circuit 302 (FIG. 7) so that, for example, at the timings shown in FIGS. 6A and 6B, the substrate voltage signal SUB with any of voltage values VHS, VMS and VLS is applied to the substrate 210 of the CCD exposure section 20 of the CCD image sensor 2.

[Overall Operation of the Third Digital Camera 5]

Next, overall operation of the third digital camera (FIGS. 8 and 9, etc.) will be described.

In the third digital camera 5, according to control from the controller 112, the middle voltage power generator circuit 6 (FIG. 8) of the CCD driver circuit 500 of the third AFE IC 50 generates power with middle voltage VMS and supplies it to the second switch SW2-2.

Power with voltages VHS and VLS is supplied from the power supply circuit 114 respectively to the first and third switches SW2-1 and SW2-3 of the substrate driver circuit 502.

The first to third switches SW2-1 to SW2-3 of the substrate driver circuit 502 open and close according to control from the controller 112 and, as explained earlier in reference to FIGS. 6A to 6C, they generate a substrate power signal SUB with voltage value VHS, VMS or VLS and applies it to the substrate 210 (FIG. 3) of the CCD exposure section 20 of the CCD image sensor 2 through the capacitor 140 and the clamp circuit comprised of the reference voltage generator circuit 240 and diode 242.

The V driver 122 supplies vertical drive signal V to the CCD exposure section 20 where the charge transferred from the PD 202 to the vertical CCD 200 (FIG. 3) is transferred to the horizontal CCD 206.

The H driver 124 supplies horizontal drive signal H to the horizontal CCD 206, and the horizontal CCD 206 outputs the charge, transferred from the vertical CCD 200, to the output amplifier 208 according to the horizontal drive signal H to output it as an analog image signal.

The A/D converter 102 of the third AFE IC 50 converts the analog image signal outputted from the CCD image sensor 2 into digital image data and outputs it to the image processing and storage module 16.

The image processing and storage module 16 stores the image data received from the AFE IC 50 and processes the data (compression, etc) and records it on the recording medium 166 or outputs it externally.

In the third digital camera 5 thus configured, low-impedance substrate power signal SUB supplied by the high performance operational amplifier 620 can be applied to the substrate 210 with a capacity of several nF.

Therefore, in the third digital camera 5, the amount of charge in the PD 202 of the CCD exposure section 20 can be controlled more properly and its saturation can be more effectively prevented than when the substrate power signal SUB is applied to the substrate 210 by obtaining voltages VHS to VLS by dividing simply by a resistor.

In addition, since the D/A converter 60 uses more elements than the high voltage amplifier 62, the size of the third AFE IC 50 can be smaller when the D/A converter 60 includes a logic circuit with a small area operating at normal supply voltage (+3 V; Vcc), etc. and only the high voltage amplifier 62 includes elements operating at a higher voltage than Vcc With voltage values VH to VL.

[Modification]

Figure 10:
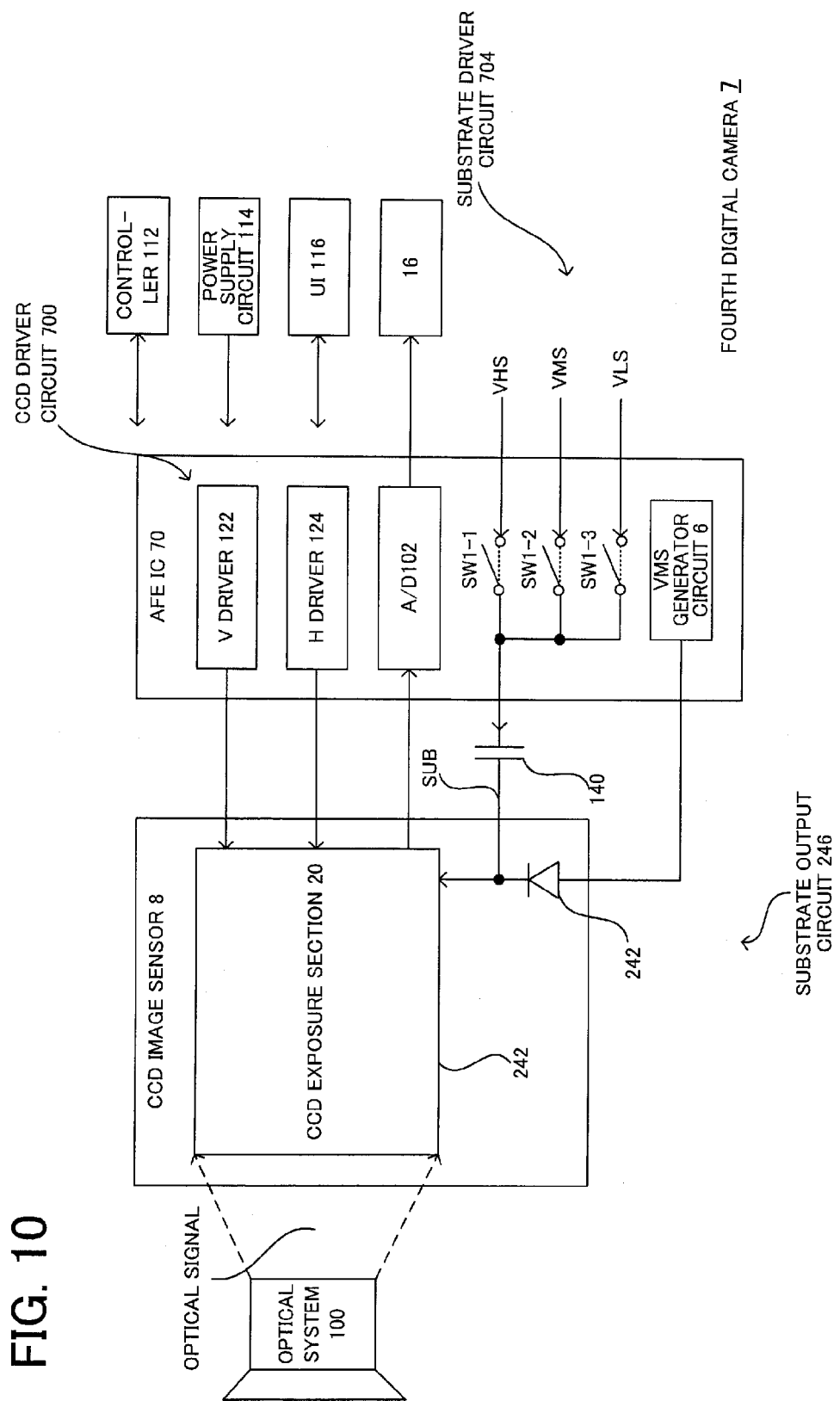
FIG. 10 illustrates the configuration of a fourth digital camera according to the present invention.

FIG. 10 shows the configuration of a fourth digital camera 7 according to the present invention.

As shown in FIG. 10, in the fourth digital camera 7, the first CCD image sensor 2 of the first digital camera 1 is replaced by a third CCD image sensor 8 including only the CCD exposure section 20 and diode 242 (FIG. 3), and the first AFE IC 12 is replaced by a fourth AFE IC 70.

In the fourth AFE IC 70, the CCD driver circuit 120 of the first AFE IC 12 is replaced by a fourth CCD driver circuit 700, and the substrate power supply circuit 126 of the first AFE IC 12 is replaced by a third substrate driver circuit 704 and the middle voltage power generator circuit 6 (FIGS. 8 and 9).

In the fourth digital camera 7, power with voltage value VHS, VMS or VLS supplied by the UI 116 is applied, as a substrate power signal SUB, to the substrate 210 (FIG. 3) of the CCD exposure section 20 of the third CCD image sensor 8 through the third substrate driver circuit 704, and also a substrate power signal SUB with a voltage value according to control from the controller 112 can be applied to the substrate through the diode 242.

The present invention can be used for image data generation using a CCD image sensor.

What is claimed is:

1. An imaging apparatus for capturing an image represented by an optical signal and converting the image into digital image data, the apparatus comprising:

a CCD imaging device having a plurality of light-receiving elements each of which is formed on a semiconductor substrate and converts an incoming optical signal into charge and accumulates the charge when a first voltage signal applied to the semiconductor substrate has a predetermined first voltage value and discharges the accumulated charge when the first voltage signal has a predetermined second voltage value, an amount of accumulated charge being controlled when the first voltage signal has a third voltage value between the first voltage value and the second voltage value, and the CCD imaging device outputting an analog electric signal indicating an amount of charge discharged from each of the light-receiving elements according to a control signal supplied from outside;

an electric signal processor; and a controller which receives fourth power with a fourth voltage value to operate and controls operation of the electric signal processor;

wherein the electric signal processor includes:

a converter circuit which converts the output electric signal into the image data;

a control signal supply circuit which supplies the control signal;

a power supply circuit which supplies third power with a voltage value corresponding to the third voltage value; and a voltage signal application circuit which selects power with the first voltage value supplied from outside, power with the second voltage value supplied from outside, or the supplied third power, and applies the selected power, as the first voltage signal, to the semiconductor substrate of the CCD imaging device; and wherein the power supply circuit includes:

a power generator circuit which receives fifth power with a voltage value higher than the fourth voltage value to operate and generates third power with a voltage value corresponding to the third voltage value from a second voltage signal having a voltage value between the fourth voltage value and 0 V; and a second voltage signal generator circuit which receives the fourth power to operate and generates the second voltage signal according to control from the controller.

2. A semiconductor device which is used together with a CCD imaging device having a plurality of light-receiving elements each of which is formed on a semiconductor substrate and converts an incoming optical signal into charge and accumulates the charge when a first voltage signal applied to the semiconductor substrate has a predetermined first voltage value and discharges the accumulated charge when the first voltage signal has a predetermined second voltage value, an amount of accumulated charge being controlled when the first voltage signal has a third voltage value between the first voltage value and the second voltage value, and the CCD imaging device outputting an analog electric signal indicating an amount of charge discharged from each of the light-receiving elements according to a control signal supplied from outside, the semiconductor device being controlled by a controller which receives fourth power with a fourth voltage value to operate;

the semiconductor device comprising:

a converter circuit which converts the output electric signal into image data;

a control signal supply circuit which supplies the control signal;

a power supply circuit which supplies third power with a voltage value corresponding to the third voltage value; and a voltage signal application circuit which selects power with the first voltage value supplied from outside, power with the second voltage value supplied from outside, or the supplied third power, and applies the selected power, as the first voltage signal, to the semiconductor substrate of the CCD imaging device; and wherein the power supply circuit includes:

a power generator circuit which receives fifth power with a voltage value higher than the fourth voltage value to operate and generates third power with a voltage value corresponding to the third voltage value from a second voltage signal having a voltage value between the fourth voltage value and 0 V; and a second voltage signal generator circuit which receives the fourth power to operate and generates the second voltage signal according to control from the controller.

3. The semiconductor device according to claim 2, wherein the power supply circuit includes:

an amplifier circuit which receives sixth power with a voltage with polarity reverse to the fifth power to operate and outputs a voltage from an output terminal as amplified so as to make a voltage applied to a first input terminal equal to a voltage applied to a second input terminal; and a feedback circuit which feeds back a voltage at the output terminal to the second input terminal to control an amplification factor of the amplifier circuit.

4. The semiconductor device according to claim 3, wherein the feedback circuit includes:

a first feedback element connected between the output terminal and the second input terminal; and a second feedback element which allows a direct current to flow between two terminals with one of the terminals connected with the second input terminal and the other connected with a predetermined voltage with the same polarity as the fifth power; and wherein the amplification factor of the amplifier circuit is controlled by a ratio of impedance of the first feedback element to impedance of the second feedback element.

5. The semiconductor device according to claim 4, wherein the first feedback element and the second feedback element are resistors.

6. The semiconductor device according to claim 3, wherein the amplifier circuit is an operational amplifier.

* * * * *